United States Patent [19]
Benestad

[11] Patent Number: 4,792,916
[45] Date of Patent: Dec. 20, 1988

[54] DIGITAL SIGNAL PROCESSING DEVICE WORKING WITH CONTINUOUS BIT STREAMS

[75] Inventor: Otto Benestad, Jar, Norway

[73] Assignee: Geophysical Company of Norway AS, Sandvika, Norway

[21] Appl. No.: 878,860

[22] Filed: Jun. 26, 1986

[30] Foreign Application Priority Data

Jun. 27, 1985 [NO] Norway ............................. 852597

[51] Int. Cl.$^4$ .............................................. G06F 15/31
[52] U.S. Cl. ................................... 364/724.17; 375/28
[58] Field of Search ................ 364/724; 375/28, 103; 333/166

[56] References Cited

U.S. PATENT DOCUMENTS

| | | | |
|---|---|---|---|
| 3,579,122 | 5/1971 | Paine | 328/167 |
| 3,633,170 | 1/1972 | Jones, Jr. | 364/724 |
| 3,822,404 | 7/1974 | Croisier et al. | 364/724 |
| 3,963,911 | 6/1976 | Franks | 364/724 |
| 3,968,354 | 7/1976 | Ferrieu | 364/724 |
| 3,987,288 | 10/1976 | Franks | 364/724 X |
| 4,016,410 | 4/1977 | Eggermont | 364/724 |
| 4,325,139 | 4/1982 | Dine | 375/28 |
| 4,384,278 | 5/1983 | Benjamin | 340/347 AD |

FOREIGN PATENT DOCUMENTS

| | | |
|---|---|---|
| 2836049 | of 1985 | Fed. Rep. of Germany . |
| 8103724 | of 1981 | PCT Int'l Appl. . |
| 1298819 | of 1972 | United Kingdom . |
| 1510322 | of 1978 | United Kingdom . |
| 2131241A | of 1984 | United Kingdom . |

OTHER PUBLICATIONS

Hosokawa et al., "Second-Order Recursive Digital Filter Using Delta Modulation" *Mem-Fac. Eng.* Osaka City Univ., Japan, vol. 16, pp. 63–72, Dec. 1975.

*Primary Examiner*—David H. Malzahn
*Attorney, Agent, or Firm*—Holman & Stern

[57] ABSTRACT

A device which can be used for digital signal processing, e.g. filtering of digital signals in the form of continuous bit streams that are linear digital representations of analogue signals. The device is composed by cascading individual filter sections. Each filter section comprises an integrating and multiplying unit, or units, an inverting unit or units and an adding unit or units.

The device has been implemented on a monolithic integrated programmable circuit together with soft controlled solid state switches such that a preferred filter configuration may be selected by programming the circuit.

9 Claims, 5 Drawing Sheets

FIRST ORDER FILTER SECTION.

Fig. 1. DELTA MODULATOR (EXAMPLE)
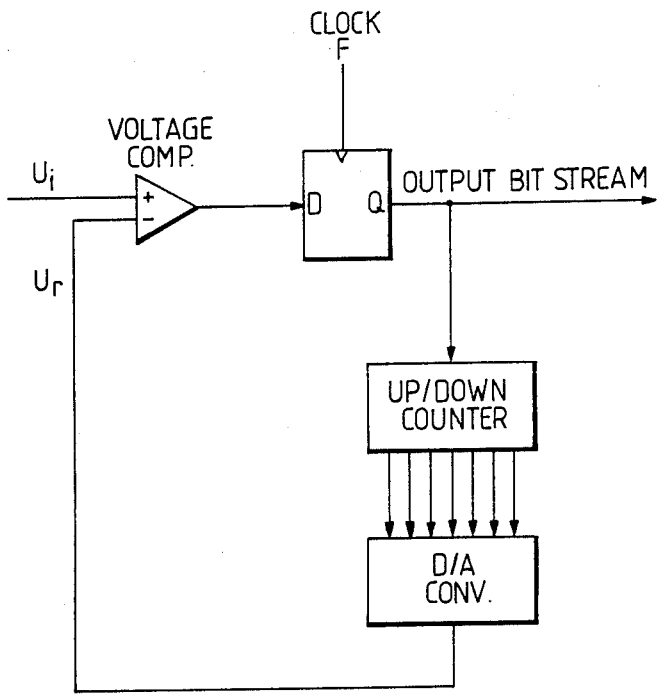
Fig. 2. BIT STREAM INTEGRATOR WITH PARALLEL OUTPUT.
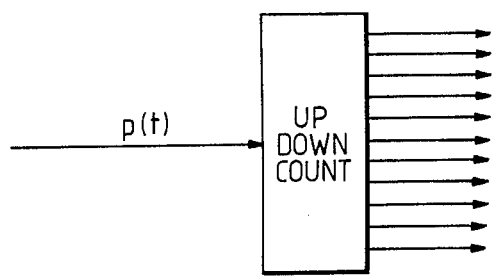

*Fig.3.* BIT STREAM INTEGRATOR AND MULTIPLIER WITH BIT STREAM OUTPUT.
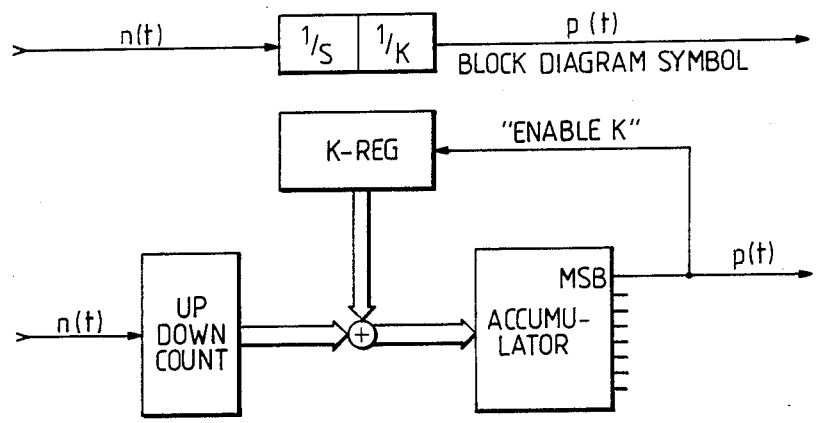
*Fig.4.* BIT STREAM DIVIDE-BY-2 CIRCUIT
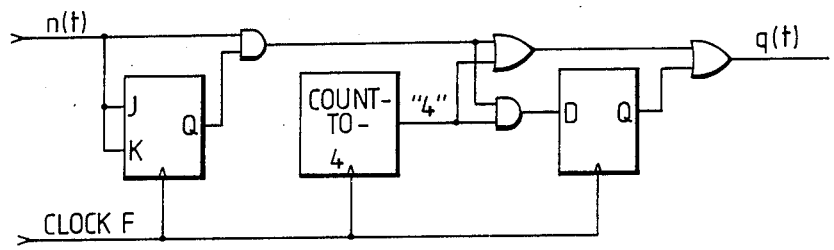
*Fig.5.* BIT STREAM INVERTER (MULTIPLY-BY-MINUS 1)
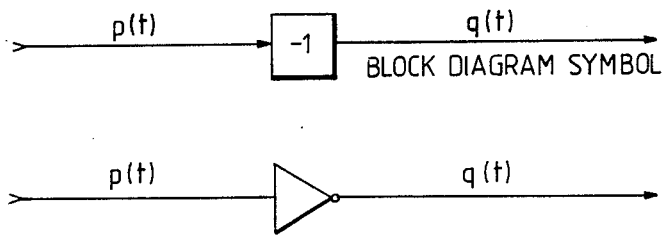

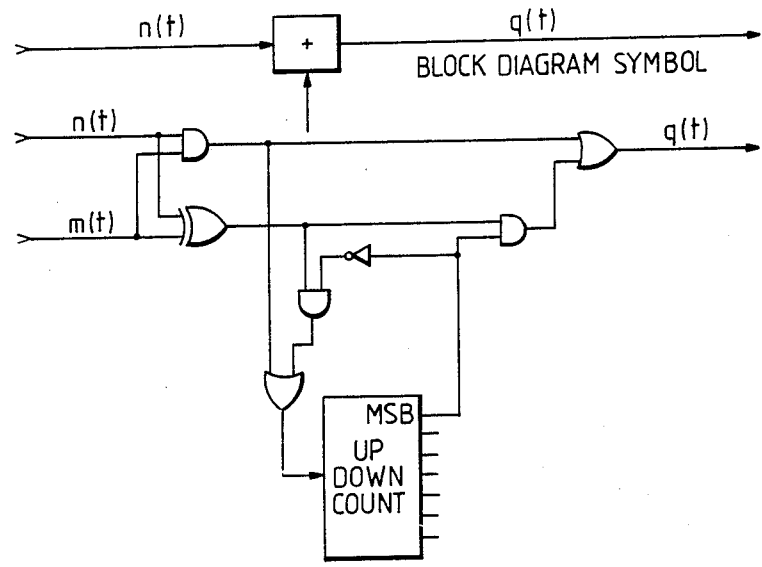
Fig.6. BIT STREAM ADDER
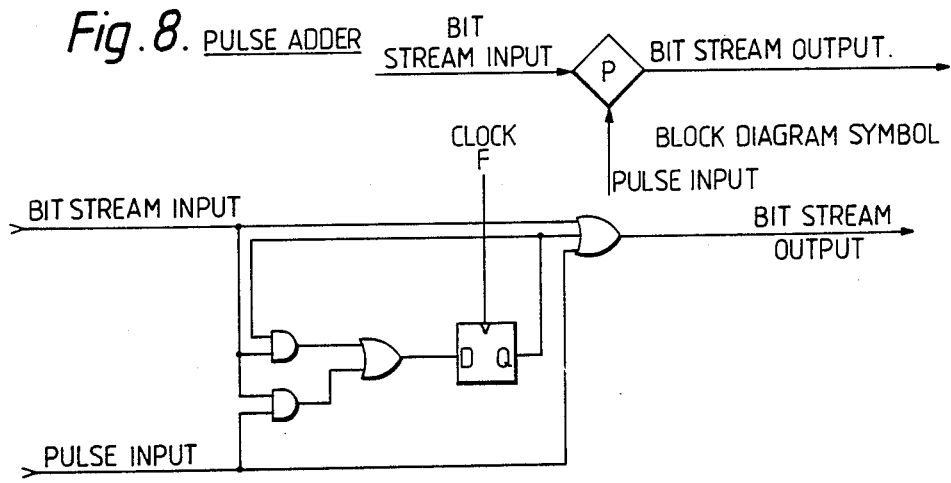
Fig.8. PULSE ADDER

Fig. 7a. FIRST ORDER FILTER SECTION.
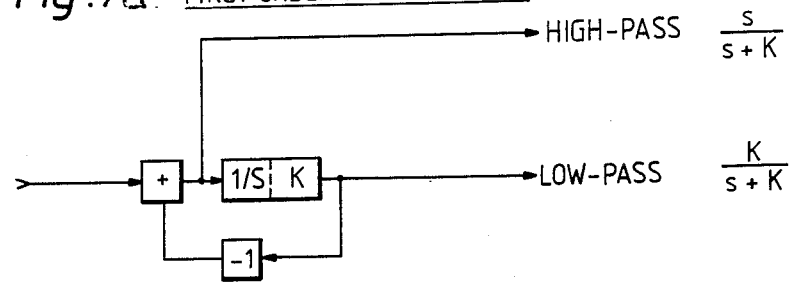
Fig. 7b. SECOND ORDER FILTER SECTION.
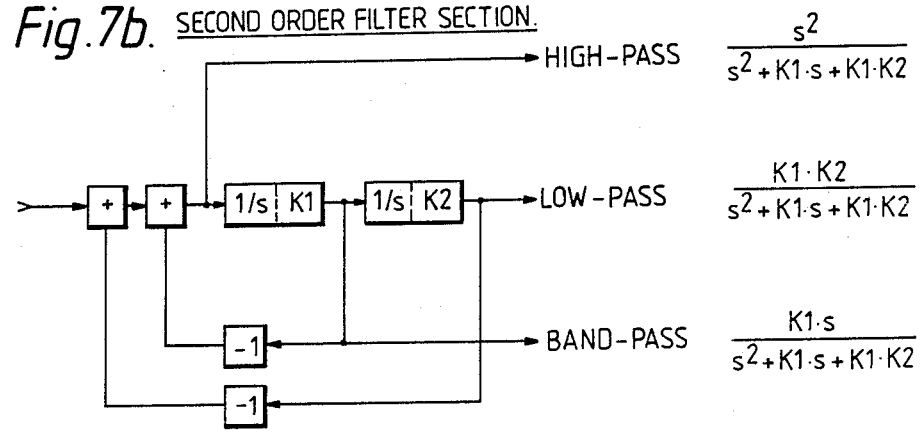
Fig. 7c. CONVENTIONAL IIR FILTER WITH BIT STREAM INPUT (EXAMPLE).
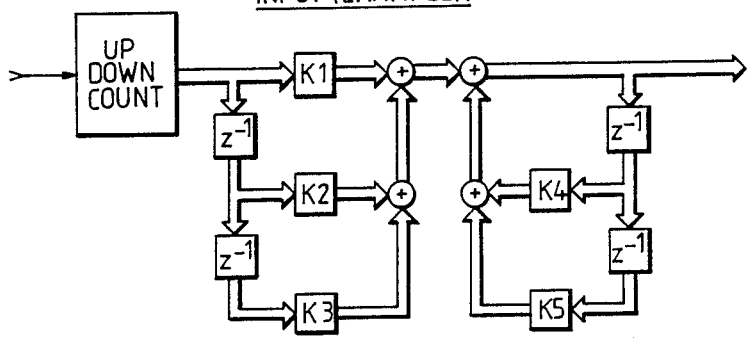

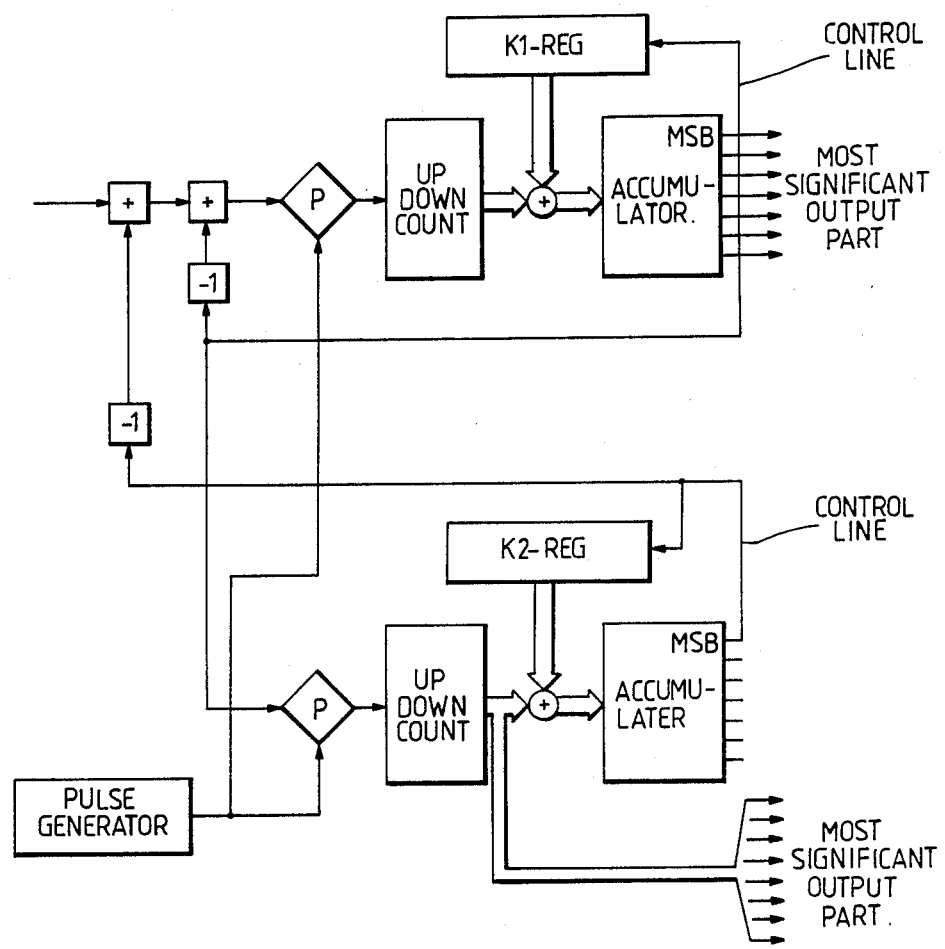
Fig. 9. OUTPUT STAGE.

DIGITAL SIGNAL PROCESSING DEVICE WORKING WITH CONTINUOUS BIT STREAMS

The present invention relates to a device that can be used for certain kinds of digital signal processing, e.g. filtering, of digital signals in the form of continuous bit streams.

The device is well suited for implementation of IIR-filters (Infinite Impulse Response filters), also called recursive filters. It is composed as a cascading of filter sections.

One important and characteristic feature of such a filter section is that it operates directly on continuous bit streams, which means that both input and output signals from the filter section appear as continuous bit streams.

A continuous bit stream is in principle a non-interrupted stream of individual signals, in which each individual signal represents the number 0 or 1. Physically, such a bit stream could be transmitted as a voltage on a pair of wires, where for instance 0 volts may represent the number 0 and for instance 5 volts may represent the number 1.

The device according to the invention is designed to operate on certain kinds of continuous bit streams, namely bit streams that are linear digital representations of analogue signals.

A common way of digitizing analogue signals is to measure (or sample) the signal at a certain regular rate (sample rate) and let each sample be given as a digital word with a certain number of bits. In this way, the analogue signal is converted into a continuous stream of digital words.

One disadvantage with this method is that errors ("aliasing") occur if the analogue signal contains frequency components higher than the Nyquist frequency, which is equal to half the sample frequency. To avoid such aliasing, either of two different methods may be used:

The analogue signal may be filtered so that the unwanted frequency components are removed before sampling and digitizing. This method often turns out to be expensive because individual trimming of the filters may be required, especially if a high degree of accuracy is demanded.

The analogue signals may as a first stage be sampled and digitized with an increased and sufficiently high sample rate. The unwanted frequency components may then be removed by digital filtering, and after this is done, a certain number of the new sample values may be removed so that the remaining ones constitute a digital representation with a reduced (and preferred) sample rate. This method requires fast electronic circuitry and consequently high price and power consumption.

As we see, both methods imply disadvantages. A third method also exist. This third method, called Delta Modulaton, is not as well known as the two others, but is nevertheless a well established technique. A delta modulator is a digitizing unit which converts a continuous analogue signal into a continuous bit stream. FIG. 1 shows the principles of a delta modulator:

The incoming analogue signal Ui is compared with an internal reference signal Ur in a voltage comparator. If Ui is larger than the reference Ur, the comparator outputs a 1, if not, a 0 is output. This stream of 1's and 0's are regularly latched to the output of the delta modulator at a certain clock rate F through a D-typed Flip-Flop. The output bit stream is also used internally to update a counter which counts up by "1" and down by "0". The parallel output of this counter is then converted to the analogue reference signal Ur in a digital-to-analogue (D/A) converter.

During normal operation and provided the clock rate F is sufficiently high, the internal reference voltage Ur will all the time and in small steps follow the input signal Ui. The up/down counter will all the time contain a digital representation of the signal, and the outputted bit stream may be transmitted on a single pair of wires to a remote up/down counter and D/A converter for reproduction of the analogue signal.

Delta modulation is used, to a certain extent, in telephone systems. Here, the voice signal is converted to a bit stream which is transmitted to the remote subscriber and then reconverted to a voice signal. Two important advantages with delta modulation are that the digital signal may be transmitted directly on a single pair of wires, and that the delta modulator itself is a simple, straightforward and low-priced device that easily may be operated at a clock rate sufficiently high to avoid the aforementioned "aliasing" problem.

Hence, bit stream representations of analogue signals seem attractive as an alternative to the conventional "digital word" representation. A disadvantage, however, is that there has until now been no straightforward and practical method for applying digital signal processing directly on such bit streams. The usual method has been to convert the bit stream to digital words by means of an up/down counter and then apply conventional digital signal processing by a series of multiplications and additions. This method requires high speed computing because the sample rate in most applications is high. Therefore, such digital filtering is often performed stepwise: First filter step removes the higher frequency components of the signal. After this, a certain number of the new sample values are removed (the signal is resampled at a lower sample rate). The input data rate to the next filter step will hence be reduced and consequently less computing power is needed. Such a stepwise resampling may, if required, be performed through several steps.

Such a filtering method is complex, and the process of designing a filter as a composed of individual sections with certain requirements to each step may imply unwanted restrictions and reduced flexibility in the filter design.

The present invention provides a new method of performing digital filtering directly on continuous bit streams. A set of new devices will be described, which devices may be configured as filter sections and cascaded to make up complete digital filters. Input and output of each filter section are bit streams of equal bit rates. Also, an output section is described, from which the filtered signal may be taken, either in the form of a bit stream or in the form of conventional resampled digital words.

The new concept makes the filter design very easy and straightforward. It takes very well care of the original signal resolution all through the different filter sections, by the fact that the sample rate is kept constant in all sections. Also, the filter sections work on an exact basis. Conventional digital filters usually suffer from truncation errors of the multiplications and additions, which in turn lead to filter noise.

In the following, the invention will be described in greater details with reference to the accompanying drawings in which FIG. 1 shows an example of a delta modulator;

FIG. 2—a bit stream integrator with parallel output;

FIG. 3—a bit stream integrator and multiplier with a bit stream output;

FIG. 4—a bit stream divide-by-2 circuit;

FIG. 5 a bit stream inverter;

FIG. 6 a bit stream adder;

FIG. 7a and 7b—the first and second order filter section, respectively;

FIG. 7c—a schematic example of a conventional IIR-filter with bit stream input;

FIG. 8—a pulse adder, and

FIG. 9—the output stage according to the invention.

We will start by establishing a characteristic function describing a continuous bit stream. Our basic assumption is that the clock rate F of the bit stream is so high that statistics is the most suitable way of describing its propeties. Hence, we define the probability function p(t) as being the probability of a "1" in the bit stream at time t. A bit stream consisting of alternating 1's and 0's will thus have a probability function p(t)=0.5 for all values of t.

We advance a step further and define the amplitude function a(t) of a bit stream as:

$$a(t) = 2p(t) - 1$$

The amplitude function a(t) will consequently at all times have a value between −1 and 1. A bit stream of alternating 1's and 0's will have an amplitude function $a(t)=0$ for all values of t.

With this amplitude definition of a bit stream, we may show that the bit stream from a delta modulator of FIG. 1 has an amplitude proportional to the first derivative of the input signal Ui. The up/down counter of FIG. 1 acts as an integrator for the bit stream: it retains its value by an input amplitude of 0 (counts alternating up and down), it counts monotonically upwards by a constant positive input amplitude (e.g. by a bit stream of all 1's) and it counts monotonically downwards by a constant negative input amplitude (e.g. by a bit stream of all 0's). And because the output of the up/down counter is proportional to the analogue input signal Ui, the input to the counter and hence the bit stream must be proportional to the derivative of Ui.

Accordingly, an up/down counter may be used as an integrator for bit streams, as shown in FIG. 2. This integrator has a parallel output. What we primarily would look for as a building block in bit stream filters is an integrator with both the output signal and the input signal in the form of bit streams.

Such a signal integrator is shown in FIG. 3. The device has a signal integrating function and in addition a multiplication function. It constitutes an important building block of the new bit stream filters and may be described as follows:

Register K stores the multiplier constant of the multiplication part. An appropriate binary number is loaded into this register during the setup of the filter. Output from the K-register is either "K" of "0" depending upon the signal "Enable K". The difference between the counter output and the K-register output is accumulated and stored in the accumulator. The output bit stream is taken from the most significant bit (MSB) of the accumulator, which bit issued as a feedback control signal "Enable K".

This "Enable K" feedback causes the number K to be subtracted from the accumulator as soon as its most significant bit has been set and therefore the accumulator will never overflow. As a consequence of this fact, after a run-in time, the input to the accumulator has an average of exactly zero. If the counter output is I(t) and the output bit stream has a probability function p(t), we get the equation:

$$I(t) - p(t).K = 0$$

or:
$$p(t) = I(t)/K$$

and the amplitude function:

$$a(t) = 2.I(t)/K - 1 = (I(t) - K/2).2/K$$

This demonstrates that the device in FIG. 3 outputs a bit stream with an amplitude function proportional to the integral I(t) of the input bit stream (the constant K/2 is not essential in this respect), and that the multiplication factor is 2/K.

One reservation must be made to the statement above that feedback of "Enable K" avoids overflow in the accumulator. In the case of saturation, that is if the output bit stream reaches an amplitude function of 1 or −1, the feedback will be insufficient to avoid overflow. Therefore, like for all other signal processing devices, the system has to be dimensioned so as to avoid saturation.

Such a dimensioning of the system may be provided by limiting the amplitude of the input bit stream, either by limiting the range of the input voltage Ui to the delta modulator, or by using a digital building block as described below that performs a division of the bit stream amplitude by 2.

Such a "divide-by-2" block may have an input probability function of n(t) and an output probability function of q(t). Our requirement, that the amplitude function is divided by 2, implies:

$$2q - 1 = (2n - 1)/2$$

$$q = n/2 + \tfrac{1}{4}$$

From this we see that proper functioning of the block is obtained by removing every second "1" in the bit stream, and after that, adding a "1" every 4th clock period. Such a circuit is shown in FIG. 4. The J-K Flip-Flop is configured as a "toggle flip-flop" (the output Q alternates from 1 to 0 or from 0 to 1 for every 1 in the bit stream), and together with the first AND-gate, this part of the circuitry removes every second "1" from the bit stream. The "4-counter and the associated OR-gate mix in a "1" for every 4th clock period, and if two 1's collide by this mixing, the D Flip-Flop and the last OR-gate provide the bit after that (which is always a "0") are converted to a "1".

The divide-by-2" circuit as described above is incorporated in the description just as an example of how to avoid saturation and does not constitute an essential part of the invention. Thus it is not included in the claims.

The next building block to be described turns out to be a very simple one. It is a unit that multiplies the amplitude of a bit stream by −1, and it is implemented simply by a logic inverter, as shown on FIG. 5. To prove this, we start by the definition of the amplitude function of the input bit stream as $a(t)=2p(t)-1$. We require the output bit stream to have an amplitude of:

$$-(2p(t)-1) = 1 - 2(p(t))$$
$$= 2 - 2p(t) - 1$$
$$= 2(1-p(t)) - 1$$

From this, we see that the output bit stream should have a probability function of $1-p(t)$, which is the inversion of the input bit stream.

The next building block to be described, is a unit which is capable of adding two bit streams and generate a third bit stream whith an amplitude equal to the sum of the two input amplitudes. We suppose that the input bit streams have probability functions $n(t)$ and $m(t)$, and that the output bit stream has the probability function $q(t)$. Our requirement is then:

$$(2n-1)+(2m-1)=2q-1$$

$$q=n+m-\tfrac{1}{2}$$

This gives:

The circuitry for this function is implemented with an internal memory that takes care of "carry" from previous clock periods. We see that if the input signals on both input lines are "1", the output bit should ideally have been "1.5". Instead, we let the circuitry output a "1" and at the same time we make an increment to a carry counter to represent the carry of "0,5". If both input lines at another instant are "0", the output bit should ideally have been "−0,5". We then let the circuitry output a "0" and at the same time we make a decrement to the carry counter to represent a carry of "−0,5". If, at a third instant the input lines have input bits of "1" and "0", the output bit should ideally have been "0,5". We then let the carry counter decide which signal is to be output: If the most significant bit of the carry counter is set, we output a "1" and make a decrement to the counter, if the most significant bit is not set, we output a "0" and make an increment to the carry counter.

The implementation of such a bit stream adder block is shown in FIG. 6 and it operates as described above.

These three basic building blocks, the integrator-and-multiplier, the inverter and the adder are sufficient to design a very wide range of IIR-filters operating directly on continuous bit streams.

When designing either an analogue filter or a digital IIR-filter, the normal procedure is to start with a choice of poles and zeros in the transfer function. Having done this, the Laplace transform of the transfer function may be written down directly on a product forms. And from this again, analogue filters may be designed in a rather straightforward manner by cascading 1st and 2nd order filter sections. In the case of conventional digital IIR-filters, the design engineer has to perform a mathematical transformation of the Laplacian transfer function in the "s-plane" to a Z-transform in the "Z-plane", and design the filter from this transformation.

By designing a bit stream filter with the three building blocks as described, the filter may be designed directly from the Laplace transform, in the same simple manner as for analogue filters.

This is demonstrated in FIGS. 7a and 7b which show a general 1st order bit stream filter section and a general 2nd order bit stream filter section respectively, together with their Laplacian transforms. As we see, the filter sections are implemented exclusively by the use of integrators (1/s) with multiplication (K), inverters (−1) and adder (+). By cascading and combining such filter sections, an unlimited number of poles and zeros may be implemented.

For comparison, FIG. 7c shows how a bit stream filter might have been designed using conventional IIR-filter technique. The input bit stream first enters an up/down counter which converts the signal to parallel form. Thereafter, the data words are passed through a series of multiplications and additions before the filtered signal is output in parallel form.

The most apparent difference between the two techniques is probably that the new technique provides an architecture that is very well suited for dedicated processing (one dedicated precessor element for each mathematical operation to be performed); this because the interconnection between the processing elements is made up of a single line instead of a wide bus. Single lines are easily switched by "soft-controlled" solid state switches so that changes in filter configuration or internal rerouting of signals may be done without hardware changes.

A further advantage is the very simple clocking; one identical signal is used all through the system.

Also, speed requirements are more moderate in the new bit stream concept. The bit stream filter requires one addition per sample period, whereas a conventional IIR-filter requires at least one multiplication to be performed per sample period.

A further advantage of the new bit stream filter concept is that all computation is done on an exact basis. This means that no truncations are performed in the calculations because all kinds of "carries" are accumulated and taken care of, and nothing is lost. In the case of a conventional IIR-filter, each multiplication results in a product term with a width of twice the input width. The product therefore has to be truncated and the least significant bits are lost forever, leading to filter noise.

Bacause of the speed requirements of a conventional IIR-filter, such a filter is often designed with stepwise resampling, which means that the sample rate is stepwise reduced through the different sections of the filter.

In this manner, the most strict speed requirement is only applicable to the first filter section. However, by this method much of the signal resolution may be lost. This is due to the fact that a resampling in principle involves the process of generating a new set of sample values, each being the mean of several old sample values. Such an averaging increases the resolution in each sample value, but the number of sample values is reduced. Hence, if the data width is not sufficiently increased by a resampling, signal resolution is lost. This is often the case of such resamplings because, if the width were increased properly, the speed requirement after the resampling would have been almost the same as before, and very little had been achieved.

The fact that the new bit stream filter is based on a constant sampling rate all through the filter sections is very good guarantee that signal resolution is taken well care of.

The conclusion therefore is that the new bit stream filter concept provides advantages in many applications, mainly with respect to accuracy and a favourable and flexible architecture.

Later we will describe an univesal output which is capable of converting continuous bit streams into resampled digital words with considerably improved resolution as compared to the unit step, that means, a resolution down to fractions of a step corresponding to one bit in the bit stream. But before we describe such an output stage, we will describe an additional building block that has to be added to a bit stream filter to assure that filter noise components too are reduced to fractions of a unit step.

It is true that a bit stream filter described so far has no truncation errors, but this does not mean that filter noise is completely avoided. Computer simulations show that noise mechanisms still exist, but also that they may be effectively suppressed. Following will describe how.

One obvious component of filter noise in the present invention stems from the ripple caused by alternating "0" and "1" in the bit stream. This ripple has however, a very high frequency and may easily be filtered out in a digital output stage.

But we also have more troublesom noise component. To demonstrate this noise mechanism, we turn to the equation of a bit stream integrator, (see above), which is:

$$I(t) - P(t)K = 0$$

We argued that the average input to the accumulator had to be exactly zero, and therefore we could write down the above equation. However, if we regard just a limited time interval of n clock periods, we get the equation:

$$nI(t) - np(t)K = C$$

Here, C is a constant that may be *different* from 0. We know that we will never have overflow in the accumulator of FIG. 3 because the "Enable K" feedback subtracts the number K when the accumulator is half filled (MSB set). Therefore the accumulator has a minimum value of $MSB - K$. We also know that when we do not have a saturation condition, "Enable K" is sufficient to reset MSB again, hence the maximum content of the accumulator is $MSB + K$. C in the equation above is the change in accumulator content over n clock periods, and from our discussions we now know that C always will lie between $-2K$ and $2K$. Putting this into the equation above and solving for p(t) we get:

$$p(t) = I(t)/K \pm 2/n$$

The conclusion from this is: Over n clock periods, maximum output error (or noise) in the probability function is $\pm 2/n$. Or in a different way: Independent of the number of clock periods n, maximum output error is $\pm 2$ pulses.

This high frequent ripple contributes by maximum error of $\pm 1$ pulse, and therefore we must also have another noise mechanism that contributes with an error of $\pm 1$ pulse.

The nature of this mechanism is rather obvious if we regard very weak signals, that means, bit streams consisting of long sequences of alternating "0" and "1" and only interrupted infrequently by a double "1" or a double "0". Suppose for example that the integrator of FIG. 3 outputs such a long sequence of alternating "0" and "1" and then a double "1". The double "1" comes as a sudden result of a slow building-up in the accumulator. Just before the double "1" output, the accumulator was hiding a signal fraction almost equal to 1 unit step.

From this discussion we may draw a very important conclusion: The noise has a frequency content given directly by the separation of the double "1"'s or the double "0"'s in the bit stream. Therefore, by injecting extra "1"'s in the input bit stream and thereby changing the "DC Offset", we can directly control the frequency content of the noise. If we use this method to move the noise up to a frequency well above the interesting signal frequencies, the noise can be filtered out in the output stage together with the ripple noise.

Therefore, if we require the lowest possible noise level from our bit stream filter, we should add a building block as shown in FIG. 8. It is called a pulse adder and has an input bit stream and an output bit stream, and in addition a pulse input from a pulse generator giving a pulse every n clock periods, where n may be selected according to the preferred application. By each pulse on the pulse input line, the pulse adder mixes a "1" into the bit stream. If the bit stream already has a "1" at that instant, the first following "0" is converted to a "1".

Such a pulse adder should be located directly in front of the integrator block. Computer simulations and practical tests show that the noise level in this way may be reduced by 2 orders of magnitude, or 40 dB, below the unit step.

Now, we will describe the output stage. The purpose of this stage is to integrate the bit stream, which is proportional to the derivative of the original input signal Ui. Also, the output stage should filter out the high frequency noise components of the signal and present resampled digital words with a resolution considerably better than the unit step. And finally, the output stage removes DC offset from the signal and for this purpose incorporates a high pass filter section as well as a low pass section.

FIG. 9 shows the output stage. It consists of a second bit stream filter section configured as band-pass, and will be explained in the following.

The upper part of the output stage is a low-pass part. It has a cutoff frequency just above the interesting signal frequency band, and it will therefore filter out noise at higher frequencies. Output from this filter section is not just the most significant bit from the accumulator, but the whole width of the accumulator is taken as a parallel output. Therefore, no information is "hidden" in the accumulator, such as it is for the previously described filter sections. If the accumulator slowly builds up for a double "1" output, everything is all the time monitored through the parallel output.

The bit stream output from the upper filter part, that means the MSB, is also taken as input to the lower filter part, which is the high-pass part. It has a cutoff frequency below the interesting signal and, and the main purpose of this part is to remove DC-offset. But the up/down counter of this filter part is also used separately as an integrator for the bit stream from the upper filter part, thus considerably increasing the width of the parallel output word.

To sum up: The output stage is a second order band-pass bit stream filter. The band-pass filtered bit stream output is the MSB from the uppermost accumulator of FIG. 9. This output bit stream is integrated in the lower up/down counter to yield a band-pass filtered and integrated parallel output which constitutes the most significant part of the parallel output word. To increase output resolution, the output from the upper accumulator is taken as an increase of the word length of the output data word and hence constitutes the least significant part of the output word.

In general, the complete output data word is made up as a weighted sum of the most significant part and the least significant part. But by proper selection of the upper filter constant K1, it is possible to match a weighting factor such that the least significant part is a direct bit increase of the most significant part. This is the case if K1 is selected as 2 raised to an integer exponent N.

In a similar manner, the lower filter constant K2 governs the fixed DC offset in the output word. By selecting K2 equal to 2 raised to an integer exponent N, the fixed DC offset will be 2 raised to N−1. This could be favourable because bit N−1 then could be taken as a sign bit, and we would apparently have no DC offset.

All through this description, we have until now supposed that the bit stream is proportional to the first derivative of the analogue input signal Ui. But we know that this will not always be the case. There are delta modulators giving bit streams proportional to the second derivative of the input signal, as well as so-called delta-sigma modulators giving bit streams directly proportional to the input signal. The described bit stream filter and output stage are equally well suited for such signals. The only change to be made is in the output stage. Here we have to add an additional integrator or derivator function. But fortunately, the only changes needed are to change the filter constants K1 or K2. If we need an additional integrator function, K1 is changed so that the cut-off is moved from above and interesting signal band to below that band. This leads to an additional down-dipping 6 dB per octave attenuation in the signal band, or in other word: and additional integral characteristic.

Equivalently, if we need an additional derivator characteristic, we change K2 so that the cut-off is moved from below the interesting signal band to above the band. This leads to an additional up-dipping 6 dB per octave attentuation in the signal band, or in other words: an additional derivator characteristic.

The present invention is primarily intended for use in marine seismic data acquisition. Such an application requires that signals from up to a thousand hydrophones are filters and digitized in in-sea electronic modules and then digitally transmitted via a cable to a surveying vessel. Requirements with regard to space and power are very strict, as well as requirements to accuracy and dynamic range.

The new bit stream technique is however equally well suited to a lot of other applications, e.g. telecommunication and digital hi-fi sound recording and reproduction.

The described bit stream filter may very well be implemented as a monolithic integrated circuit, which means that a complete filter network including an output stage may be built into a single silicon chip. The filter network could then be designed with a flexible architecture, in that soft controlled solid state switches might be incorporated so that the filter configuration could be set up as a programming of the chip, as well as programming the filter constants K. A study has shown that 12 filter sections, each with a K-register length of 22 bits and with a clock rate of 10 MHz may be implemented as a CMOS circuit on a relatively moderate chip area (7×7 mm). This filter may beconfigured with up to 6 second-order sections, up to 12 first-order sections or some combination of these, and the output resolution could be up to 44 bits. However, taking account of the noise level, the number of useful bits will be limited to somewhere between 24 and 32 bits, depending on the application.

I claim:

1. A device for digitally filtering continuous bit streams that are linear digital representations of analog signals, said device comprising a plurality of individual filter sections connected in cascade, each said individual filter section having a bit stream input fed from a respective previous filter section and a bit stream output feeding a respective next filter section, said respective bit stream inputs and outputs being at the same data rate, each said filter section including:
   at least one integrating and multiplying unit for outputting a bit stream equal to an integral of an input bit stream input thereto multiplied by a selectable constant;
   at least one inverting unit for outputting a bit stream equal to an input bit stream input thereto multiplied by −1; and
   at least one adding unit for outputting a bit stream euqal to the sum of two respective input bit streams input to respective inputs thereof;
   output signals from said integrating and multiplying, inverting and adding units all being bit streams with the same bit rate as said input bit streams input thereto, said integrating and multiplying, inverting and adding units being connected together as a first-order filter section wherein an input bit stream is applied to a first input of said adding unit, an output bit stream from said adding units is applied to an input of said integraing and multiplying unit, and an output bit stream of said integrating and multiplying unit is fed via said inverting unit to a second input of said adding unit.

2. A device according to claim 1 wherein each said integrating and multiplying unit comprises:
   an up/down counter that counts up by one for each "1" bit in the input bit stream and down by one for each "0" bit in the input bit stream;
   a register containing a programmable number "K", an output word of the register being either "K" or "0" in accordance with a control signal input thereto, an output of the up/down counter being combined together with the output of the register; and
   an accumulator which, for each clock period of the device, adds said combined outputs from said up/down counter and said register to a previously accumulated content of said accumulator and outputs the most significant bit of the total thereof as an output bit stream while at the same time applying said most significant bit via a control line as a control signal to said register for enabling the output from said register when said control signal is a "1" and for inhibiting the output from said register when said control signal is a "0".

3. A device according to claim 1 wherein each said adding unit for adding two bit streams together comprises a plurality of logic gates and an up/down carry counter and wherein
   if both inputs to the adding unit are "1" bits, then the output of the adding unit is a "1" bit and the carry counter is forced to count up; and
   if both inputs to the adding unit are "0" bits, then the carry counter is forced to count down; and if the respective inputs to the adding unit are "1" and "0" respectively and the most significant bit of the carry counter is set at "1", then the output of the adding unit is "1" and the carry counter is forced to count down; and if the respective inputs to the adding unit are "1" and "0" respectively and the most significant bit of the carry counter is cleared at "0", then the output of the adding unit is "0" and the carry counter is forced to count up.

4. A device according to claim 1, wherein each filter section further comprises at least one pulse adding unit having a bit stream input, a pulse input and a bit stream output and placed directly before an integrating and multiplying unit of said filter section, each said pulse adding unit being comprised of a plurality of logic gates and a flip-flop configured such that the output bit stream of said pulse adding unit equals the input bit stream applied thereto, except that each time a pulse is received at said pulse input thereof the next "0" bit occuring in the input bit stream applied thereto is converted to a "1" bit in the output bit stream therefrom.

5. A device for digitally filtering continuous bit streams that are linear digital representations of analog signals, said device comprising a plurality of individual filter sections connected in cascade, each said individual filter section having a bit stream input fed from a respective previous filter section and a bit stream output feeding a respetive next filter section, said respective bit stream inputs and outputs being at the same data rate, each said filter section including:

at least two integrating and multiplying units for each outputting a bit stream equal to an integral of an input stream input thereto multiplied by a selectable constant;

at least two inveting units for each outputting a bit stream equal to an input bit stream input thereto multiplied by −1; and at least two adding units for each outputting a bit stream equal to the sum of two respective input bit streams input to respective inputs thereof;

output signals from said integrating and multiplying, inverting and adding units all being bit streams with the same bit rate as said input bit streams input thereto, said integrating and multiplying, inverting and adding units being connected together as a second-order filter section wherein an input bit stream is applied to a first input of a first adding unit, an output bit stream from said first adding unit is applied to a first input of a second adding unit, an output bit stream from said second adding unit is applied to an input of a first integrating and multiplying unit, an output bit stream from said first integrating and multiplying unit is applied to an input of a second integrating and multiplying unit and also via a first inverting unit to a second input of said second adding unit, and an output bit stream of said second integrating and multiplying unit is applied via a second inverting unit to a second input of said first adding unit.

6. A device according to claim 5 wherein each said integrating and multiplying unit comprises:

an up/down counter that counts up by one for each "1" bit in the input bit stream and down by one for each "0" bit in the input bit stream;

a register containing a programmable number "K", an output word of the register being either "K" or "0" in accordance with a control signal input thereto, an output of the up/down counter being combined together with the output of the register; and an accumulator which, for each clock period of the device, adds said combined outputs from said up/down counter and said register to a previously accumulated content of said accumulator and outputs the most significant bit of the total thereof as an output bit stream while at the same time applying said most significant bit via a control line as a control signal to said register for enabling the output from said register when said control signal is a "1" and for inhibiting the output from said register when said control signal is a "0".

7. A device according to claim 5 wherein each said adding unit for adding two bit streams together comprises a plurality of logic gates and an up/down carry counter and wherein if both inputs to the adding unit are "1" bits, then the output of the adding unit is a "1" bit and the carry counter is forced to count up; and if both inputs to the adding unit are "0" bits, then the carry counter is forced to count down; and if the respective inputs to the adding unit are "1" and "0" respectively and the most significant bit of the carry counter is set at "1", then the output of the adding unit is "1" and the carry counter is forced to count down; and if the respective inputs to the adding unit are "1" and "0" respectively and the most significant bit of the carry counter is cleared at "0", then the output of the adding unit is "0" and the carry counter is forced to count up.

8. A device according to claim 5, wherein each filter section further comprises at least one pulse adding unit having a bit stream input, a pulse input and a bit stream output and placed directly before an integrating and multiplying unit of said filter section, each said pulse adding unit being comprised of a plurality of logic gates and a flip-flop configured such that the output bit stream of said pulse adding unit equals the input bit stream applied thereto, except that each time a pulse is received at said pulse input thereof the next "0" bit occuring in the input bit stream applied thereto is converted to a "1" bit in the output bit stream thereform.

9. A device according to claim 8, wherein one of said second order filter sections is adapted as an output stage having band-pass characteristics, with at least one pulse adding unit being placed immediately before each integrating and multiplying unit of said filter section, said filter section further comprising parallel output lines from an accumulator of a first integrating and multiplying unit thereof and from an up/down counter of a second integrating and multiplying unit thereof, for providing parallel outputs as well as serial bit stream outputs from said output stage.

* * * * *